Sept. 20, 1955 J. STEGMUELLER 2,718,590
MIXER STAGE OF A SUPERHETERODYNE RECEIVER
Filed Sept. 22, 1954
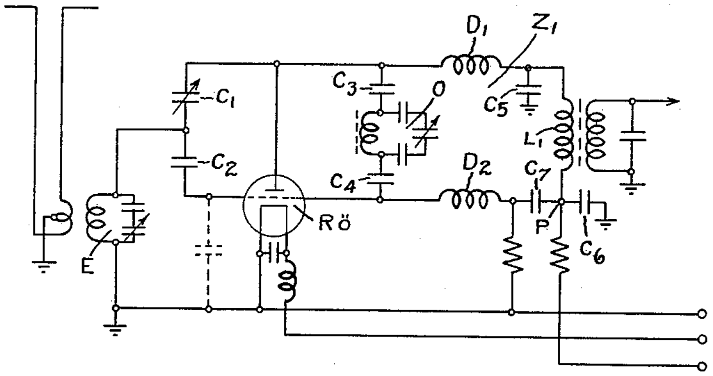
INVENTOR:
JOHANN STEGMUELLER,
BY Donald M. Timbie
HIS ATTORNEY.

United States Patent Office 2,718,590

Patented Sept. 20, 1955

2,718,590

MIXER STAGE OF A SUPERHETERODYNE RECEIVER

Johann Stegmueller, Pforzheim-Broetzingen, Germany, assignor to Telefunken Gesellschaft für drahtlose Telegraphie m. b. H., Berlin, Germany, a corporation of Germany Application September 22, 1954, Serial No. 457,604

10 Claims. (Cl. 250—20)

My invention relates to the mixer stage of a superheterodyne receiver and particularly to a mixer circuit including a self-oscillating mixer tube operating with additive mixing. Although it is particularly useful for ultra-high-frequency, or U. H. F., reception, it is not limited to use in this range.

The use of a directly heated triode as a mixer tube in such a circuit, for example in portable receivers, leads to great difficulties in obtaining a sufficiently high oscillator voltage because the conversion conductance of such mixer tubes is relatively small. Moreover, the requirement that stable operation of the oscillator be insured even in battery operation and the resulting different voltages, must also be fulfilled at the lower voltage limit. It is also desirable that the difference in the mixer-amplifications should be as small as possible, whether new or old batteries are used.

My invention proposes a circuit which satisfies all these requirements to a remarkably high degree. The invention comprises means for connecting the oscillator circuit, in a capacitive three-point circuit between the three electrodes of the mixer tube in such a way that the intermediate frequency circuit, or at least the intermediate frequency coil, is decoupled from the plate of this mixer tube at the oscillator frequency by a high frequency choke.

It is, therefore, an object of this invention to provide an improved mixer stage for a superheterodyne receiver in which the intermediate frequency circuit has little or no effect in the operation of the oscillator.

It is another object of the invention to provide an improved mixer stage for a superheterodyne receiver in which the intermediate frequencies produced in the mixer stage are prevented from appearing in the source of signals.

It is still another object of this invention to provide an improved mixer stage for a superheterodyne receiver in which the energy of the oscillator section is prevented from reaching the source.

The explanation of a high oscillator voltage obtained by the use of a capacitive three-point circuit is as follows: The tube capacitances already form a capacitive voltage divider. This is why it is not advisable to use an inductive voltage divider for the three-point circuit, because when two voltage dividers are present at the same time, the optimum oscillatory condition is unobtainable. To this is added the fact that the connections also play a part in the U. H. F. range and may produce undesirable phase changes. If, on the other hand, only the tube capacitances are used as voltage dividers of the three-point circuit, or if additional capacitors are added to the tube capacitances (preferably close to the tube), only a single voltage divider, i. e., a capacitive voltage divider, is obtained.

In such an oscillatory circuit the triode alone will not produce the maximum oscillator voltage with self-oscillating mixer tube. It is necessary to prevent a capacitive loading of the oscillator by the intermediate frequency circuit because the additional capacitance resulting from the addition of the intermediate frequency coil reduces the resonance impedance of the oscillator circuit, not only because of the capacitance itself, but mainly because the losses of this capacitance are too high for the U. H. F. oscillator circuit. This loading by the intermediate frequency coil is avoided by the insertion of a U. H. F. coil (a $\lambda/4$ choke).

According to a further development of the invention, especially efficient means may be used to eliminate the loading of the intermediate frequency circuit without impairing the working of the oscillator.

The manner in which these advantageous results may be obtained will be better understood after the following discussion of the single figure of the drawing.

The resonant circuit O tuned, for example, by means of a variable capacitor is connected through the capacitors $C_3$ and $C_4$ to the anode and grid of the mixer tube Rö. The three-point circuit is formed by the two capacitors $C_1$ and $C_2$ and the parallel capacitance of the tube. In the line between the common point of capacitors $C_1$ and $C_2$ on one hand, and the ground on the other, is inserted the input circuit E so as to prevent the latter from carrying the oscillator voltage and radiating through the antenna.

The intermediate frequency circuit $Z_1$, following the mixer tube, is essentially formed in this example by the inductances $D_1$, $D_2$ and $L_1$ and the capacitances $C_1$ to $C_6$. A U. H. F. choke $D_1$ prevents the capacitances, shown to the right in the diagram, from being connected in parallel with the resonance circuit O. In order that the oscillator voltage may be applied mainly to the choke $D_1$, a capacitor $C_5$ is added. It has been found that the bridge circuit, formed by the resonance circuit with the input circuit E, in the diagonal is not in equilibrium over the entire receiving range, due to the fact that the coil $L_1$ represents a capacitance which depends greatly upon the frequency of the oscillator. The addition of the capacitor $C_5$ leads to a practically fixed capacitance.

To isolate the intermediate frequency circuit $Z_1$ from the damping effects of the mixer tube, the applicant proposed to apply the intermediate frequency voltage, appearing at point P, as the result of the action of a capacitive voltage divider between the capacitors $C_1$ and $C_6$, to the grid of the mixer tube via the grounded end of the input circuit E. Tests have shown that the circuit proposed by the invention requires a slightly different method of removing the damping. The capacitor $C_6$ is made so large that it presents a short-circuit for the intermediate frequency so that the intermediate frequency at point P is practically zero. The intermediate frequency voltage, used to remove the damping, is obtained generally by connecting point P over U. H. F. choke $D_2$ to the grid of the mixer tube. The inductances $L_1$ and $D_2$, whose junction point P is grounded as far as the intermediate frequency is concerned, then form an inductive three-point circuit so that an intermediate frequency voltage for removing the damping is generated across the choke $D_2$. This choke $D_2$ also blocks the oscillator voltage, generated at the grid, from reaching point P, and thus from ground.

If the choke $D_2$ is so designed that it will block the oscillator frequency, the intermediate frequency feedback, as was found by tests, may become too large. To avoid this, the capacitance $C_7$ may be made so small that the reactance of the coil $D_2$ and the capacitance $C_7$ added together will cause an intermediate frequency voltage of the proper magnitude to be applied to the grid.

The capacitive three-point circuit may also be obtained by using a circuit proposed by applicant in which an inductance of the proper size is connected in parallel with the capacitance on the plate side of the capacitive voltage divider, in order to obtain the optimum oscillatory conditions.

While I have illustrated a particular embodiment of my invention, it will of course be understood that I do not wish to be limited thereto since various modifications both in the circuit arrangement and in the instrumentalities may be made, and I contemplate by the appended claims to cover any such modifications as fall within the true spirit and scope of the invention.

What I claim as new and desire to secure by Letters Patent of the United States is:

1. A mixer circuit for a superheterodyn receiver comprising, in combination, an oscillator amplifier having an anode, a grid and a cathode, first and second capacitors connected in series between said anode and said grid, a source of signal oscillations, connections for coupling said source between the junction of said capacitors and said cathode, a parallel resonant circuit for controlling the frequency of oscillations of said amplifier, means for coupling said parallel resonant circuit between said anode and said grid, said capacitors and said parallel resonant circuit forming a bridge circuit that is balanced for the frequency of the oscillations of said oscillator amplifier so that energy from the oscillator is prevented from being coupled to said source.

2. A mixer circuit for a superheterodyne receiver comprising, in combination, an amplifier having an anode, a grid and a cathode, first and second condensers coupled in series between said anode and said grid, an oscillatory circuit coupled between said anode and said grid, a source of signal oscillations coupled between the junction of said first and second condensers and said cathode, said oscillatory circuit having a high impedance for energy of an intermediate frequency that is produced by the heterodyning of the signals from said source and the oscillation energy produced by said amplifier.

3. A mixer circuit for a superheterodyne receiver comprising, in combination, an oscillator amplifier having an anode, a grid and a cathode, first and second capacitors connected in series between said anode and said grid, a source of signals coupled between the junction of said capacitors and said cathode, an oscillatory circuit coupled between said anode and said cathode, said oscillatory circuit and said condensers forming a bridge circuit for energy of the frequency of said oscillator in which said amplifier is connected in a first diagonal of said bridge circuit and said source of signals is connected across a second diagonal of said bridge circuit, said bridge circuit having a predetermined balance point such that energy of the oscillation frequency appearing across said second diagonal and hence across said source is substantially zero.

4. A mixer circuit for a superheterodyne receiver comprising, in combination, an oscillator amplifier having an anode, a grid and a cathode, first and second capacitors connected in series between said anode and said grid, a source of signals coupled between the junction of said capacitors and said cathode, an oscillatory circuit coupled between said anode and said cathode, said oscillatory circuit and said condenser forming a bridge circuit for energy of the frequency of said oscillator in which said amplifier is connected in a first diagonal of said bridge circuit and said source of signals is connected across a second diagonal of said bridge circuit, said bridge circuit having a predetermined balance point such that energy of the oscillation frequency appearing across said second diagonal and hence across said source is zero, a transformer having a primary and a secondary, means for coupling said primary between said anode and said grid in such manner that energy of the intermediate frequency appears at said anode and said grid with opposite respective phases.

5. A mixer circuit for a superheterodyne receiver comprising, in combination, an oscillator amplifier having an anode, a grid and a cathode, first and second capacitors connected in series between said anode and said grid, a source of signals coupled between the junction of said capacitors and said cathode, an oscillatory circuit coupled between said anode and said cathode, said oscillatory circuit and said condensers forming a bridge circuit for energy of the frequency of said oscillator in which said amplifier is connected in a first diagonal of said bridge circuit and said source of signals is connected across a second diagonal of said bridge circuit, said bridge circuit having a predetermined balance point such that energy of the oscillation frequency appearing across said second diagonal and hence across said source is substantially zero, a transformer having a primary and a secondary, means for coupling said primary winding between said anode and said grid, means for grounding an intermediate point of the circuit formed by said coupling means and said primary winding, the coupling means being of such nature that the ratio of the impedance for energy of intermediate frequency and the intermediate point and the impedance for intermediate frequency between said grid and the intermediate point is the same as the ratio of the impedance of said first and second condensers for energy of the intermediate frequency so that the bridge formed by said first and second condensers and said coupling means is balanced and energy of the intermediate frequency between the junction of said condensers and said grounded intermediate point has substantially zero amplitude, thereby preventing any energy of intermediate frequency from flowing through said source.

6. A mixer circuit for a superheterodyne receiver comprising, in combination, an amplifier having an anode, a grid and a cathode, first and second condensers connected in series between said anode and said grid, an oscillatory circuit, means for coupling said oscillatory circuit between said anode and said grid, a source of signals connected between the junction of said first and second condensers and said cathode, an intermediate frequency transformer having primary and secondary windings, a choke coil for the frequency of said oscillatory circuit connected between said anode and one end of said primary winding, a third condenser connected between said cathode and the other end of said primary winding, said third condenser providing a low impedance path for the intermediate frequency produced by the mixing of the signals from said source and the oscillations produced in said amplifier under the control of said oscillatory circuit, and a phase shifting impedance connected between said second end of said primary winding and said grid so that energy of said intermediate frequency has substantially zero amplitude at the junction of said first and second condensers, thereby being prevented from passing through said source.

7. A mixer circuit as set forth in claim 6 wherein a fourth capacitor having a high impedance for frequencies in the range of the frequency of said oscillatory circuit is connected between said cathode and the junction of said choke and said primary winding so as to aid in preventing detuning of said oscillatory circuit by said intermediate frequency transformer.

8. A mixer circuit as set forth in claim 6 wherein said phase shifting impedance is comprised of a choke for intermediate frequencies.

9. A mixer circuit as set forth in claim 7 wherein said phase shifting impedance is comprised of a choke for intermediate frequencies and a fifth condenser connected in series.

10. A mixer circuit for a superheterodyne receiver comprising an amplifier having an anode, a grid and a cathode, first and second condensers connected in series in the order named between said anode and said grid, a source of signals connected between the junction of the first and second condensers and said cathode, an oscillatory circuit connected between said anode and said grid so as to cause said amplifier to oscillate at a frequency determined by said oscillatory circuit, said oscillatory circuit having high impedance for the intermediate frequency produced by the beat between the frequency of said oscillator and the frequency of said signal, an intermediate frequency transformer having primary and secondary windings, a choke coil for frequencies higher than the intermediate frequency connected between said anode and one end of said primary winding, a third condenser having a low reactance for frequencies of the oscillatory circuit and high reactance for the intermediate frequencies, means for connecting said third condenser between the junction of said choke and one end of said primary winding and said cathode, a fourth condenser having a low reactance for the intermediate frequency, means for connecting said fourth condenser between the other end of said winding and said cathode, a source of fixed operating potential connected to said other end of said primary winding, a choke coil and a fifth condenser connected in series so as to form a phase shifting impedance, said series combination being connected between said other end of said primary winding and said grid so as to provide at the junction of said first and second condensers a voltage of intermediate frequency that is substantially equal and opposite to the voltage of intermediate frequency arriving at said junction via said first condenser, thus preventing any energy of the intermediate frequency from passing through said source of signals.

No references cited.